(12) United States Patent
Mis et al.

(10) Patent No.: US 6,222,279 B1
(45) Date of Patent: *Apr. 24, 2001

(54) SOLDER BUMP FABRICATION METHODS AND STRUCTURES INCLUDING A TITANIUM BARRIER LAYER

(75) Inventors: Joseph Daniel Mis, Cary; Gretchen Maerker Adema, Raleigh; Mark D. Kellam, Chapel Hill; W. Boyd Rogers, Raleigh, all of NC (US)

(73) Assignee: MCNC, Research Triangle Park, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/063,422

(22) Filed: Apr. 20, 1998

Related U.S. Application Data

(62) Division of application No. 08/744,122, filed on Nov. 5, 1996, which is a continuation of application No. 08/407,196, filed on Mar. 20, 1995, now abandoned.

(51) Int. Cl.⁷ ........................... H01L 23/48; H01L 23/52; H01L 29/40
(52) U.S. Cl. ........................... 257/779; 257/780; 257/781
(58) Field of Search ................................. 287/779, 780, 287/781, 763, 762, 764, 766

(56) References Cited

U.S. PATENT DOCUMENTS

| 3,663,184 | 5/1972 | Wood et al. | 29/195 |
|---|---|---|---|
| 3,839,727 | 10/1974 | Herdzik et al. | 357/71 |
| 4,042,954 | 8/1977 | Harris | 357/71 |

(List continued on next page.)

FOREIGN PATENT DOCUMENTS

| 0 261 799 A1 | 3/1988 | (EP) . |
|---|---|---|
| 0 566 253 A1 | 10/1993 | (EP) . |
| 0 660 403 A1 | 6/1995 | (EP) . |

(List continued on next page.)

OTHER PUBLICATIONS

Castrucci et al., Terminal Metallurgy System for Semiconductor Devices, *IBM Technical Disclosure Bulletin*, 9:1805, No. 12 (May 1967).

Tessier et al., Process Considerations in Fabricating Thin Film Multichip Modules, *Proceedings of the Technical Conference*, 1:294 (Sep. 1989).

Yung et al., Electroplated Solder Joints for Flip–Chip Applications, *Trans. on Components, Hybrids, and Manufacturing Technology* 14:549, No. 3 (1991).

(List continued on next page.)

*Primary Examiner*—Sheila V. Clark
(74) *Attorney, Agent, or Firm*—Alston & Bird LLP

(57) ABSTRACT

A method for fabricating solder bumps on a microelectronic device having contact pads includes the steps of depositing a titanium barrier layer on the device, forming an under bump metallurgy layer on the titanium barrier layer, and forming one or more solder bumps on the under bump metallurgy layer. The solder bump or bumps define exposed portions of the under bump metallurgy layer which are removed, and then the exposed portion of the titanium barrier layer is removed. The titanium barrier layer protects the underlying microelectronic device from the etchants used to remove the under bump metallurgy layer. The titanium layer also prevents the under bump metallurgy layer from forming a residue on the underlying microelectronic device. Accordingly, the titanium barrier layer allows the under bump metallurgy layer to be quickly removed without leaving residual matter thereby reducing the possibility of electrical shorts between solder bumps.

7 Claims, 4 Drawing Sheets

U.S. PATENT DOCUMENTS

| | | | |
|---|---|---|---|
| 4,237,607 | 12/1980 | Ohno | 29/840 |
| 4,273,859 | 6/1981 | Mones et al. | 430/315 |
| 4,293,637 | 10/1981 | Hatada et al. | 430/314 |
| 4,513,905 | 4/1985 | Nowicki et al. | 228/123 |
| 4,661,375 | 4/1987 | Thomas | 427/89 |
| 4,840,302 | 6/1989 | Gardner et al. | 228/123 |
| 4,950,623 | 8/1990 | Dishon | 437/183 |
| 5,108,950 | 4/1992 | Wakabayashi et al. | 437/183 |
| 5,130,779 | 7/1992 | Agarwala et al. | 357/67 |
| 5,134,460 | 7/1992 | Brady et al. | 357/71 |
| 5,162,257 | 11/1992 | Yung | 437/183 |
| 5,234,149 | 8/1993 | Katz et al. | 228/123.1 |
| 5,268,072 | 12/1993 | Agarwala et al. | 156/664 |
| 5,272,111 | 12/1993 | Kosaki . | |
| 5,277,756 | 1/1994 | Dion . | |
| 5,289,631 | 3/1994 | Koopman et al. | 29/840 |
| 5,293,006 | 3/1994 | Yung | 174/261 |
| 5,296,407 | 3/1994 | Eguchi . | |
| 5,298,459 | 3/1994 | Arikawa et al. . | |
| 5,376,584 * | 12/1994 | Agarwala . | |
| 5,391,521 | 2/1995 | Kim . | |
| 5,396,702 | 3/1995 | Dautartas | 29/840 |
| 5,440,167 | 8/1995 | Iranmanesh . | |
| 5,457,345 * | 10/1995 | Cook et al. . | |
| 5,459,087 | 10/1995 | Mochizuki . | |
| 5,470,787 | 11/1995 | Greer . | |
| 5,471,092 * | 11/1995 | Chan et al. . | |
| 5,498,573 | 3/1996 | Whetten . | |
| 5,796,168 * | 8/1998 | Datta et al. . | |

FOREIGN PATENT DOCUMENTS

| | | |
|---|---|---|
| 0 690 504 A1 | 1/1996 | (EP) . |
| 55-111127 | 8/1980 | (JP) . |
| 55-156339 | 12/1980 | (JP) . |
| 56-49543 | 5/1981 | (JP) . |
| 56-66057 | 6/1981 | (JP) . |
| 57-11141 | 3/1982 | (JP) . |
| 57-73952 | 5/1982 | (JP) . |
| 57-197838 | 12/1982 | (JP) . |
| 59-117135 | 7/1984 | (JP) . |
| 59-154041 | 9/1984 | (JP) . |
| 60-180146 | 9/1985 | (JP) . |
| 5013421 | 1/1993 | (JP) . |

OTHER PUBLICATIONS

Yung et al., FLip–Chip Process Utilizing Electroplated Solder Joints, *Proceedings of the Technical Conference*, p. 1065 (1990).

Yu et al., *Soldier Bump Fabrication By Electroplating For Flip–Chip Applications*, 1993 IEEE/CHMT Int'l Electronics Manufacturing Technology Symposium, Apr. 10, 1993, pp. 277–281.

International Search Report, PCT/US96/03657, Oct. 15, 1996.

* cited by examiner

SOLDER BUMP FABRICATION METHODS AND STRUCTURES INCLUDING A TITANIUM BARRIER LAYER

CROSS-REFERENCE TO RELATED APPLICATIONS

This application is a divisional of application Ser. No. 08/744,122, filed Nov. 5, 1996, which is a continuation of Ser. No. 08/407,196, filed Mar. 20, 1995, now abandoned.

The Government of the United States of America may have rights in this invention pursuant to Contract No. 94-50-001 awarded by the Office of the Advanced Research Projects Agency.

FIELD OF THE INVENTION

This invention relates to microelectronic device manufacturing methods and structures, and more particularly to methods of forming electrical and mechanical connections for a microelectronic device, and the connections so formed.

BACKGROUND OF THE INVENTION

High performance microelectronic devices often use solder balls or solder bumps for electrical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection—C4" or "flip-chip" technology, and will be referred to herein as solder bumps.

In the original solder bump technology developed by IBM, the solder bumps are formed by evaporation through openings in a shadow mask which is clamped to an integrated circuit wafer. For example, U.S. Pat. No. 5,234,149 entitled "Debondable Metallic Bonding Method" to Katz et al. discloses an electronic device with chip wiring terminals and metallization layers. The wiring terminals are typically essentially aluminum, and the metallization layers may include a titanium or chromium localized adhesive layer, a co-deposited localized chromium copper layer, a localized wettable copper layer, and a localized gold or tin capping layer. An evaporated localized lead-tin solder layer is located on the capping layer.

Solder bump technology based on an electroplating method has also been actively pursued. The electroplating method is particularly useful for larger substrates and smaller bumps. In this method, an "under bump metallurgy" (UBM) layer is deposited on a microelectronic substrate having contact pads thereon, typically by evaporation or sputtering. A continuous under bump metallurgy layer is typically provided on the pads and on the substrate between the pads, in order to allow current flow during solder plating.

An example of an electroplating method with an under bump metallurgy layer is disclosed in U.S. Pat. No. 5,162,257 entitled "Solder Bump Fabrication Method" to Yung and assigned to the assignee of the present application. In this patent, the under bump metallurgy layer contains a chromium layer adjacent the substrate and pads, a top copper layer which acts as a solderable metal, and a phased chromium/copper layer between the chromium and copper layers. The base of the solder bump is preserved by converting the under bump metallurgy layer between the solder bump and contact pad into an intermetallic of the solder and the solderable component of the under bump metallurgy layer. Multiple etch cycles may, however, be needed to remove the phased chromium/copper layer and the bottom chromium layer. Even with multiple etch cycles, the under bump metallurgy layer may be difficult to remove completely, creating the risk of electrical shorts between solder bumps.

Notwithstanding the above mentioned patents, there still exists a need in the art for methods for forming solder bumps and solder bump structures formed thereby wherein the exposed portion of the under bump metallurgy layer can be readily and completely removed after electroplating the solder bumps thereby reducing the possibility of electrical shorts between solder bumps. There also exists a need in the art for a method for forming solder bumps wherein the solder bump need not be significantly undercut when the exposed portion of the under bump metallurgy layer is removed thereby reducing the possibility of mechanical or electrical failure.

SUMMARY OF THE INVENTION

It is therefor an object of the present invention to provide an improved method for fabricating solder bumps for microelectronic device contact pads, and improved solder bumps formed thereby.

It is another object of the present invention to reduce the time required to remove the exposed portion of the under bump metallurgy layer after electroplating the solder bump.

It is still another object of the present invention to reduce electrical shorts between solder bumps.

It is yet another object of the present invention to reduce the undercutting of solder bumps when the under bump metallurgy layer is removed after electroplating.

These and other objects are provided according to the present invention by depositing a continuous titanium barrier layer on the microelectronic device before forming the under bump metallurgy layer. Accordingly, the under bump metallurgy layer can be selectively removed from the titanium layer, and the titanium layer can then be removed from the microelectronic device. The titanium layer prevents the under bump metallurgy layer from forming residues on the microelectronic device which could result in electrical shorts between solder bumps. In addition, the titanium barrier layer protects the underlying microelectronic device from the etchants used to remove the under bump metallurgy layer.

According to one aspect of the present invention, a method for forming solder bumps includes the steps of depositing a titanium barrier layer on the microelectronic device including contact pads, forming an under bump metallurgy layer on and in contact the titanium barrier layer, and then forming a solder bump on the under bump metallurgy layer whereby the solder bump is spatially separated from the titanium barrier layer. The solder bump defines exposed portions of the under bump metallurgy layer and the titanium barrier layer which are each selectively removed. Accordingly, the exposed portions of the under bump metallurgy layer can be quickly and completely removed after electroplating solder bumps without significantly undercutting the solder bumps or leaving residues which could result in shorts between solder bumps.

The exposed portion of the under bump metallurgy layer can be selectively removed using etchants which attack the under bump metallurgy layer preferentially with respect to the solder bump and the titanium barrier layer. The titanium barrier layer can then be selectively removed using an etchant that preferentially attacks the titanium barrier layer with respect to the solder bump and the portion of the under bump metallurgy layer remaining beneath the solder bump.

The under bump metallurgy layer preferably comprises a chromium layer on the titanium barrier layer, a phased layer of chromium and copper on the chromium layer, and a copper layer on the phased layer. In this embodiment, a mixture of ammonium hydroxide and hydrogen peroxide can be used to selectively etch the copper portions of the under bump metallurgy layer; hydrochloric acid can be used to etch the chromium portions of the under bump metallurgy layer; and hydrofluoric acid buffered with ammonium fluoride can be used to selectively etch the titanium layer.

A solder dam can also be formed on the under bump metallurgy layer in areas not to be covered by the solder bump, and this solder dam is preferably removed before removing the exposed portions of the under bump metallurgy layer. The solder dam preferably includes a solder non-wettable layer such as a chromium or titanium layer. The solder dam may also include a layer of a solder wettable material, such as copper, on the solder non-wettable layer.

After formation, the solder bump can be reflowed. The step of reflowing the solder bump can generate a reaction between the solder bump and the unexposed portion of the under bump metallurgy layer adjacent the solder bump resulting in an intermetallic region wherein the etchant used to remove the copper portions of the under bump metallurgy layer attacks copper preferentially with respect to the intermetallic region.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. For clarity, the thickness of layers has been exaggerated. Like numbers refer to like elements throughout.

Figure 1:
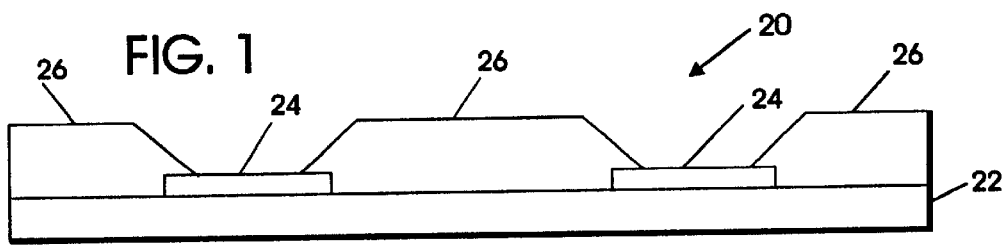
FIGS. 1–6 illustrate cross-sectional views of a microelectronic device with contact pads during various steps of a first method for forming solder bumps according to the present invention.

As shown in FIG. 1, a microelectronic device 20 may include a substrate 22, a plurality of contact pads 24, and a passivation layer 26. The substrate 22 may comprise a layer of a semiconducting material such as silicon, gallium arsenide, silicon carbide, diamond, a printed circuit board or multilayer substrate, or other substrate materials known to those having skill in the art. The contact pads 24 may comprise aluminum, copper, titanium, an intermetallic including combinations of the aforementioned metals such as AlCu and AlTi$_3$, or other materials known to those having skill in the art. The passivation layer 26 is preferably a polyimide layer but can alternately be a silicon dioxide layer, a silicon nitride layer, or layers of other passivation materials known to those having skill in the art. As shown, the passivation layer preferably covers top edge portions of each of the contact pads opposite the substrate, leaving the central surface portion of each of the contact pads 24 exposed.

It may be desired to provide solder bumps on the microelectronic device 20 so that the device can be connected, electrically and mechanically, to another microelectronic device such as a circuit board or other next level packaging substrate. The contact pads are first pretreated to remove any native oxide as will be understood by those having skill in the art. A continuous titanium barrier layer 28 (about 500 Ångstroms thick) is formed across the passivation layer 26 and the exposed surface portions of the contact pads 24. The titanium barrier layer 28 can be readily etched away from the passivation layer 26 without significantly etching the passivation layer. If titanium contact pads are used, the pretreatment step can be eliminated because the titanium barrier layer will getter oxygen out of a titanium contact pad.

A continuous under bump metallurgy layer is then formed on the titanium barrier layer 28. The under bump metallurgy layer is formed from materials which provide adequate adhesion between a solder bump and a contact pad, and which can be selectively etched away from the titanium barrier layer 28 without significantly etching the titanium barrier layer. Accordingly, the under bump metallurgy layer preferably comprises a chromium layer 30 (about 1000 Ångstroms thick), a phased layer 32 of chromium and copper (about 1000 Ångstroms thick) on the chromium layer, and a copper layer 34 (about 1 micron thick) on the phased layer. Under bump metallurgy layers including a chromium layer, a phased layer of chromium and copper, and a copper layer are discussed, for example, in U.S. Pat. No. 5,162,257 entitled "Solder Bump Fabrication Method" to Yung, the disclosure of which is hereby incorporated herein in its entirety by reference.

Figure 2:
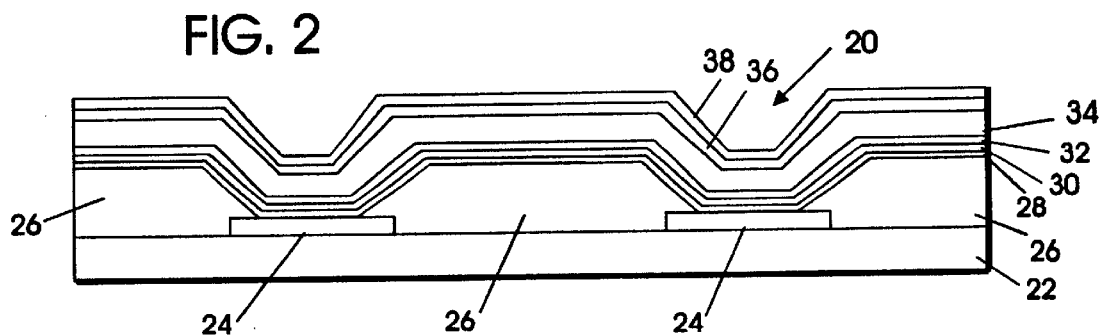

After forming the under bump metallurgy layer, a solder dam is provided. In a preferred embodiment, the solder dam includes a solder non-wettable layer 36 (about 1500 Ångstroms thick) which is preferably a layer of chromium or titanium. The solder dam may also include a solder wettable layer 38 (about 125 Ångstroms thick), such as a copper layer, on the solder non-wettable layer 36. For example, a solder dam with a copper layer on a chromium layer allows solder to be plated thereon, while a later reflow step will dissolve the copper exposing the chromium. In this embodiment, solder can be uniformly electroplated on the solder wettable layer 38 of the solder dam. The portions of the solder wettable layer not covered by solder are then removed, thereby preventing the solder bump from expanding during the reflow step. When the solder is heated above its liquidous temperature (approximately 312° C. for solder having 95% lead and 5% tin) the solder will reflow, dissolving the remaining portions of the wettable layer 38, and come into contact with the solder non-wettable layer 36. Accordingly, the reflowed solder bump will form a substantially spherical shape due to surface tension. FIG. 2 shows the microelectronic device 20 with the titanium barrier layer 28; the under bump metallurgy layer having a chromium layer 30, a phased layer 32 of chromium and copper, and a copper layer 34; and the solder dam having a solder non-wettable layer 36 and a solder wettable layer 38. Each of the layers of titanium, chromium, phased chromium and copper, and copper may be formed by evaporation, sputtering, or other deposition techniques known to those having skill in the art. The phased layer of chromium and copper may be formed by co-depositing chromium and copper.

Figure 3:
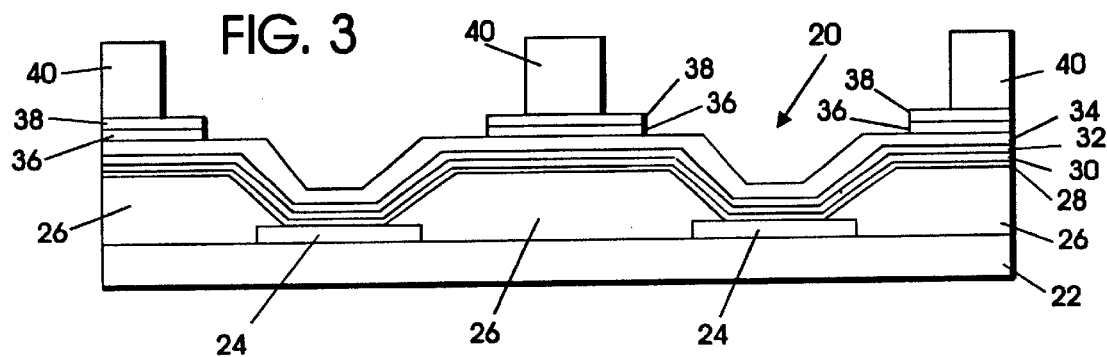

The solder dam is selectively removed, as shown in FIG. 3, in areas over the contact pads 24 where solder bumps are desired. Portions of the solder dam may be selectively removed by standard photolithography/etch techniques or by a lift-off technique. If standard photolithography/etch techniques are used, titanium is preferably used for the solder non-wettable layer 36 because titanium can be selectively etched from the underlying copper layer 34 without significantly etching the copper layer. The areas of the copper layer 34 left uncovered by the solder dam (layers 36 and 38) define the surface area of the solder bumps on the microelectronic device after the reflow step, as discussed below.

Figure 4:
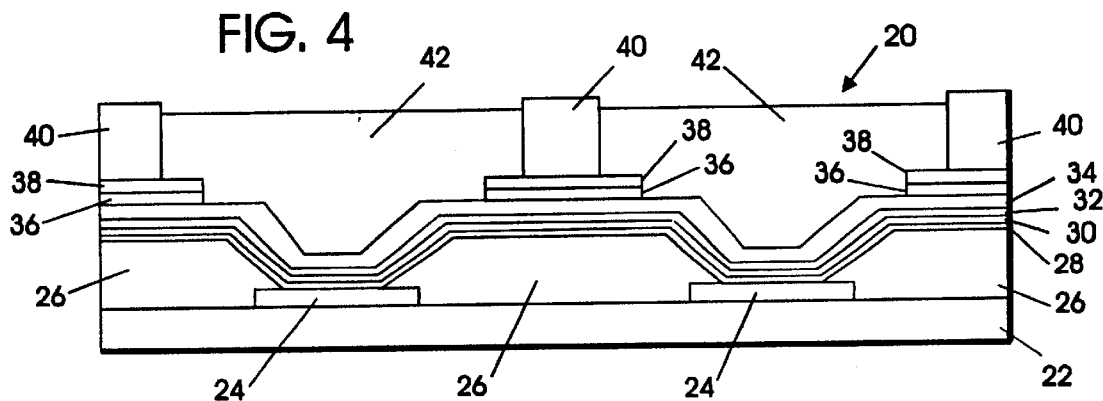

A patterned mask layer 40, such as a photoresist mask, is also formed on the solder dam to define uncovered areas over the solder dam and under bump metallurgy layer on which solder is to be electroplated. The surface areas left uncovered by the mask layer 40 can be larger than the respective surface areas left uncovered by the solder dam (layers 36 and 38) to allow the plating of solder over larger areas, as shown in FIGS. 3 and 4. The solder bump 42 is electroplated on the areas left uncovered by the mask layer 40, as shown in FIG. 4.

The solder is plated on the uncovered portions of the solder dam and under bump metallurgy layer using electroplating techniques known to those having skill in the art. For example, the surface of the microelectronic device 20 with the mask layer 40 is exposed to a plating solution containing lead and tin, and an electrical bias is applied to the continuous under bump metallurgy layer including the chromium layer 30, the phased layer 32 of chromium and copper, and the copper layer 34. The electrical bias causes lead-tin solder to plate on the uncovered portions of the copper layers 34 and 38 forming solder bumps 42, as shown in FIG. 4.

The volume of solder plated can be controlled by controlling the area left uncovered by the mask layer 42, the electrical bias applied, the concentration of the plating solution, and the duration of the plating step. Because solder may not uniformly plate on a solder non-wettable material such as chromium, the use of a solder dam with a solder wettable layer 38, such as a copper layer, over the solder non-wettable layer 36 allows the solder to be uniformly plated over the solder dam in areas not covered by the mask layer. Accordingly, the area over which solder is to be plated, and the resulting volume plated, can be determined independently of the area left uncovered by the solder dam, which determines the surface area of the solder bump on the microelectronic device after reflow.

Figure 5:
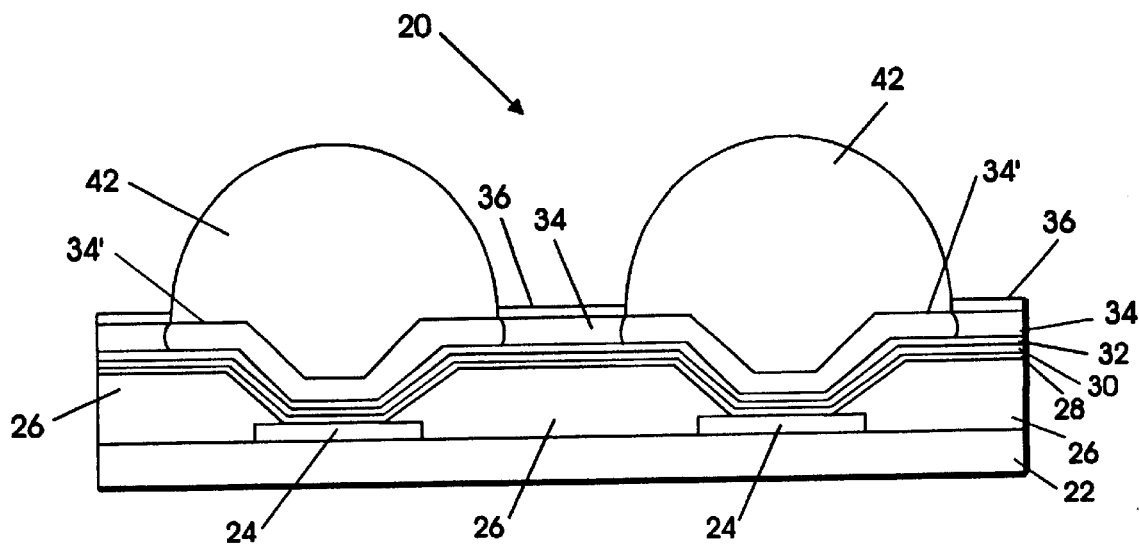

After completing the plating step, the mask layer 40 and the portions of the solder wettable layer 38 not covered by the solder bumps are removed, and the solder bumps 42 are heated above the liquidous temperature (approximately 312° C. for solder having 95% lead and 5% tin) so that they reflow, as shown in FIG. 5. If the solder wettable layer is a copper layer, a mixture of ammonium hydroxide and hydrogen peroxide can be used to remove the solder wettable layer. Where a solder bump was electroplated over the solder wettable layer 38 of the solder dam, the solder wettable layer 38 dissolves into the solder bump exposing the solder non-wettable layer 36 of the solder dam to the solder bump. Accordingly, surface tension causes the reflowed solder bumps 42 to form a substantially spherical shape on the portion of the under bump metallurgy layer not covered by the solder dam. When the solder bumps cool, the solder solidifies maintaining the substantially spherical shape.

In addition, the reflowed solder forms an intermetallic region 34' with a portion of the under bump metallurgy layer adjacent the solder bump. In the preferred embodiment, the under bump metallurgy layer includes a chromium layer 30, a phased layer 32 of chromium and copper, and a copper layer 34; and the solder reacts with a portion of the copper layer 34 to form intermetallic region 34'. This intermetallic region may include $Cu_3Sn$ which does not significantly react with etchants commonly used to remove copper, chromium, and titanium.

Figure 6:
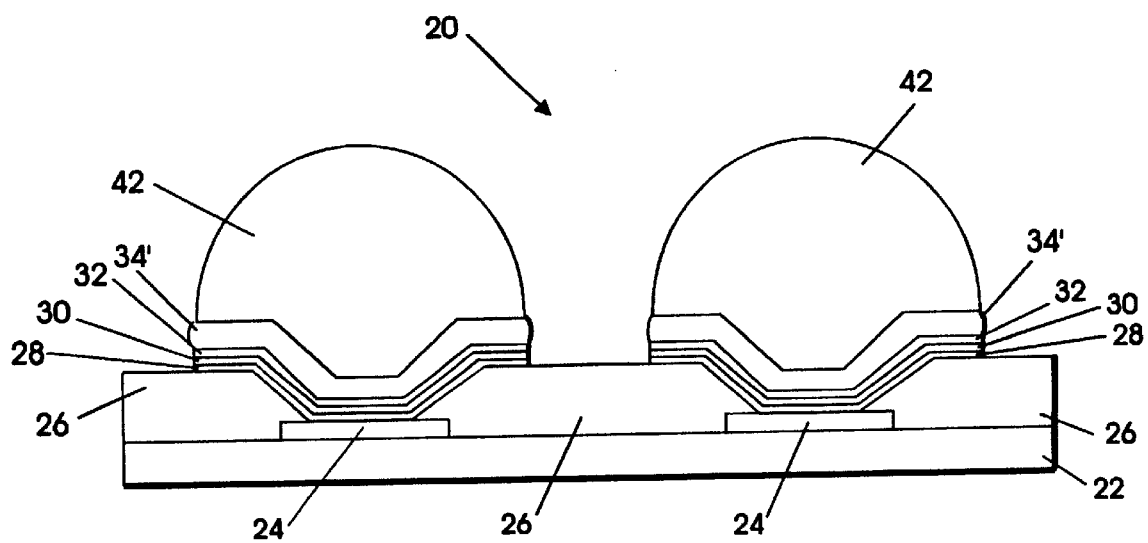

As shown in FIG. 5, the reflowed solder bumps 42 define exposed and unexposed portions of the under bump metallurgy layer. Accordingly, the solder bumps 42 can be used to mask portions of the under bump metallurgy layer which will be used to support the solder bumps. The portions of the under bump metallurgy layer left exposed by the solder bumps will be removed so that each solder bump 42 will be electrically isolated from each of the other solder bumps, as shown in FIG. 6.

It may first be necessary to remove the solder non-wettable layer 36. If the non-wettable layer is chromium, hydrochloric acid can be used to remove the non-wettable layer. Alternately, if titanium is used for the non-wettable layer, hydrofluoric acid buffered with ammonium fluoride can be used.

The portions of the under bump metallurgy layer left exposed by the solder bumps 42 can be efficiently removed from the titanium barrier layer 28 while the titanium barrier layer protects the underlying passivation layer 26 and contact pad 24. The exposed portion of titanium barrier layer can then be removed using etchants which do not significantly affect the underlying passivation layer.

For example, a chemical etchant such as a mixture of ammonium hydroxide and hydrogen peroxide can be used to etch the copper layer 34 which is left exposed by the solder bumps 42. This mixture preferentially attacks the copper layer with respect to the solder bumps, the titanium barrier layer 28, and the intermetallic region 34'. Accordingly, this etch will not significantly reduce the solder volume of the solder bumps or significantly undercut the solder bumps. This mixture will also remove some of the copper from the phased layer 32 of chromium and copper.

A chemical etchant such as hydrochloric acid can be used to etch the remaining portion of the phased layer 32 and the chromium layer 30 which have been left exposed by the solder bumps. This acid preferentially attacks the phased layer and the chromium layer with respect to the solder bump, the titanium barrier layer, and the intermetallic region 34'. This acid will remove the remaining exposed portions of the under bump metallurgy layer from the titanium barrier layer without leaving significant residues.

A titanium etchant such as hydrofluoric acid buffered with ammonium fluoride can be used to etch the portion of the titanium barrier layer 28 left exposed by the solder bumps 42. This acid preferentially attacks the titanium with respect to the solder bump 42, the intermetallic region 34', the phased layer 32 of chromium and copper, and the chromium layer 30. If a polyamide layer is used as the passivation layer 26, this acid will not significantly attack the passivation layer. If silicon dioxide or silicon nitride is used for the passivation layer, this acid may attack the passivation layer to some degree. The etching of these materials can be minimized by limiting the duration of the etch to the time required to remove the titanium barrier layer. Accordingly, polyimide is the preferred material for the passivation layer. The final solder bump structure is shown in FIG. 6.

Without the titanium barrier layer, the under bump metallurgy layer may be difficult to completely remove after the reflow step and undesired conductive residues may be left on the microelectronic device. Applicants theorize that the under bump metallurgy layer reacts with the passivation layer forming a conductive reactant at the interface between the two layers. This conductive reactant may be difficult to etch without undercutting the solder bump or reducing the volume of the solder bump thereby resulting in the undesired conductive residues. These residues may result in electrical shorts between solder bumps.

The use of the titanium barrier layer allows the under bump metallurgy layer to be efficiently removed after the reflow step while reducing the incidence of residues which could form electrical shorts between solder bumps. The titanium barrier layer prevents the under bump metallurgy layer from reacting with the passivation layer thereby reducing residues. The titanium barrier layer can then be etched away from the passivation layer without leaving any significant residue.

The elimination of the undesired residues typically results in a reduction in the time required to remove the conductive layers between solder bumps despite the fact that an additional layer has been added to the structure. Because the titanium layer reduces the overall etch time thereby reducing the time that the solder bump is exposed to the etchants, the potential for under cutting is reduced. The addition of the titanium barrier layer may also increase production yields and reduce the possibility of device failures. Solder bumps formed according to the method described above also have a low electrical resistance. For example, a solder bump with a circular surface with a 50 $\mu$m diameter on a microelectronic device has demonstrated an electrical resistance of approximately 3 milliohms.

Figure 7:
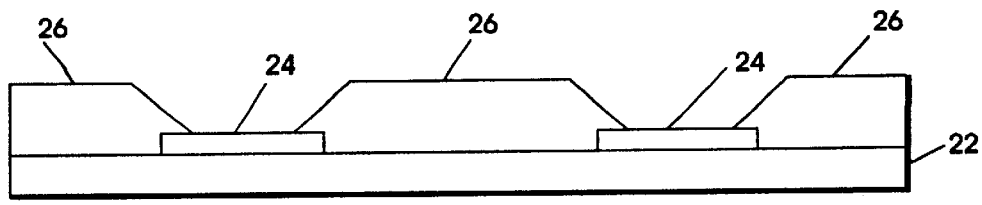
Figure 8:
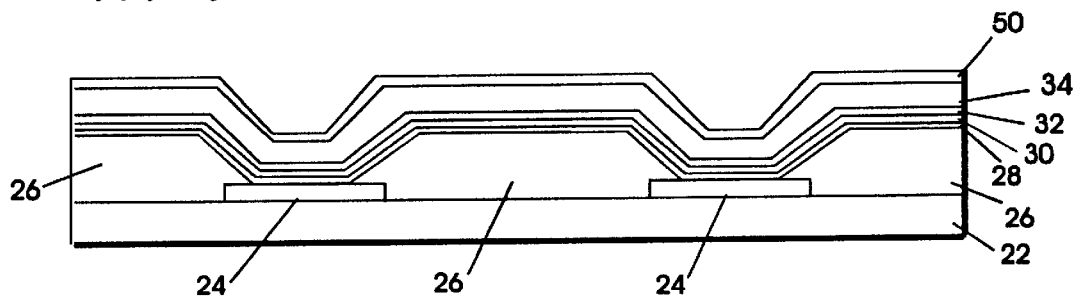
FIGS. 8–12 illustrate cross-sectional views of a microelectronic device with contact pads during various steps of a second method for forming solder bumps according to the present invention.

A variation of the method discussed above with regard to FIGS. 1–6 is shown in FIGS. 7–12. FIG. 7 shows a microelectronic device 20 with a substrate 22, contact pads 24, and passivation layer 26 as discussed above with regard to FIG. 1. FIG. 8 shows the addition of a titanium barrier layer 28, and an under bump metallurgy layer including a chromium layer 30, a phased layer 32 of chromium and copper, and a copper layer 34, as discussed above with regard to FIG. 2. In FIG. 8, however, the solder dam 50 has only a single solder non-wettable layer, which is preferably a titanium layer (about 1000 Ångstroms thick).

Figure 9:
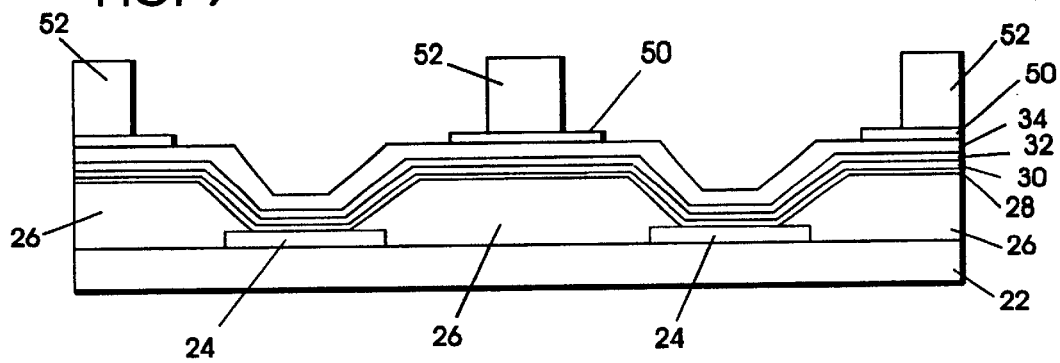

The use of a titanium solder dam layer allows the implementation of a single mask method during solder bump formation as shown in FIG. 9. Here, the mask layer 52, such as a photoresist mask or other mask known to those having skill in the art, is patterned prior to patterning the solder dam 50. The mask layer 52 is then used to pattern the solder dam 50. Accordingly, only one photolithography step is required to pattern both the mask layer and the solder dam. A titanium layer is preferably used for the solder dam because it can be selectively removed from the copper layer 34 using an etchant such as hydrofluoric acid buffered with ammonium fluoride which preferentially attacks titanium with respect to copper and solder. The solder dam 50 does not require a solder wettable layer because solder is not plated on the solder dam. Here, the solder dam 50 only prevents the solder bump 54 from spreading during the reflow step.

Figure 10:
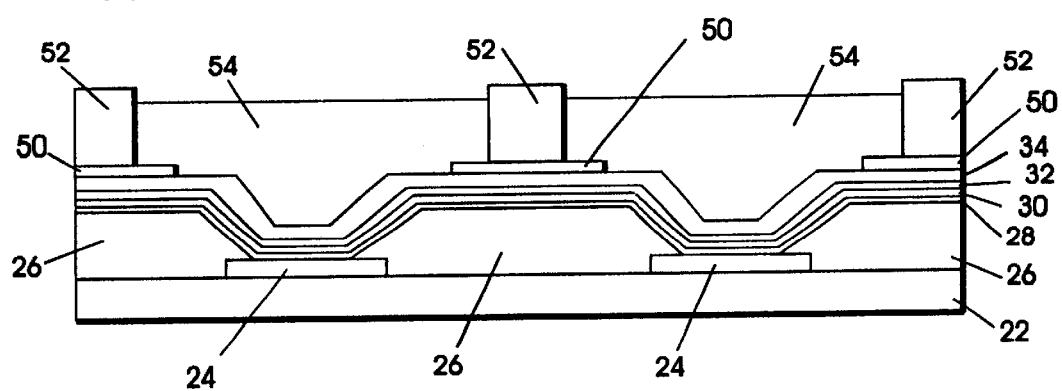
Figure 11:
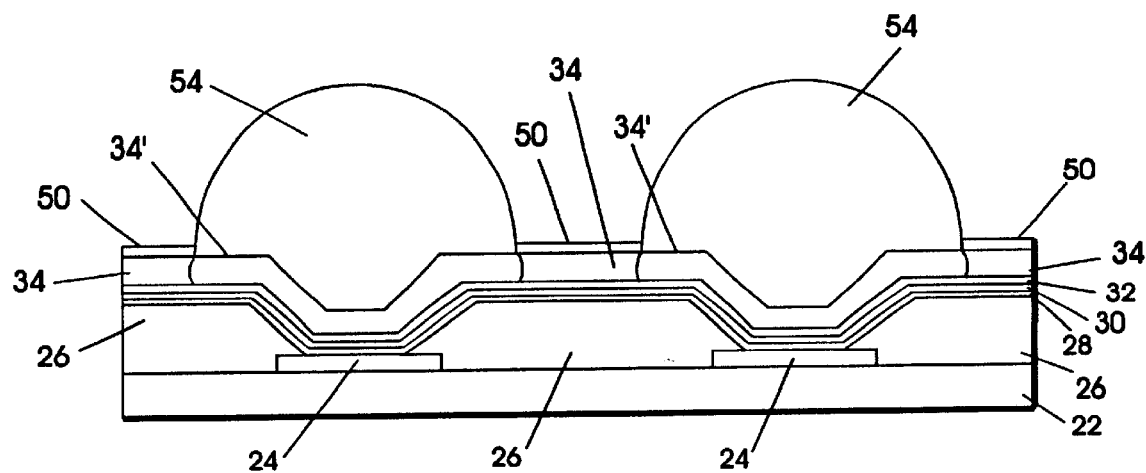

The mask layer 52 and the solder dam 50 define an area on the under bump metallurgy layer on which solder will be plated, as shown in FIG. 10. The plating step is the same as that discussed above with regard to FIG. 4 except that the solder is not plated over portions of the solder dam. After plating the solder bumps, the mask layer 40 is selectively removed, and the solder bumps are heated above the liquidous temperature (about 312° C. for solder having 95% led and 5% tin) to reflow the solder. The solder dam 50 prevents the reflowed solder from flowing beyond the desired areas. Surface tension causes the reflowed solder bumps 54 to form a substantially spherical shape as shown in FIG. 11. When the solder bumps cool, they solidify and maintain this shape. The reflow step may also be used to form an intermetallic region 34' in the copper layer 34 as discussed above with regard to FIG. 5.

Figure 12:
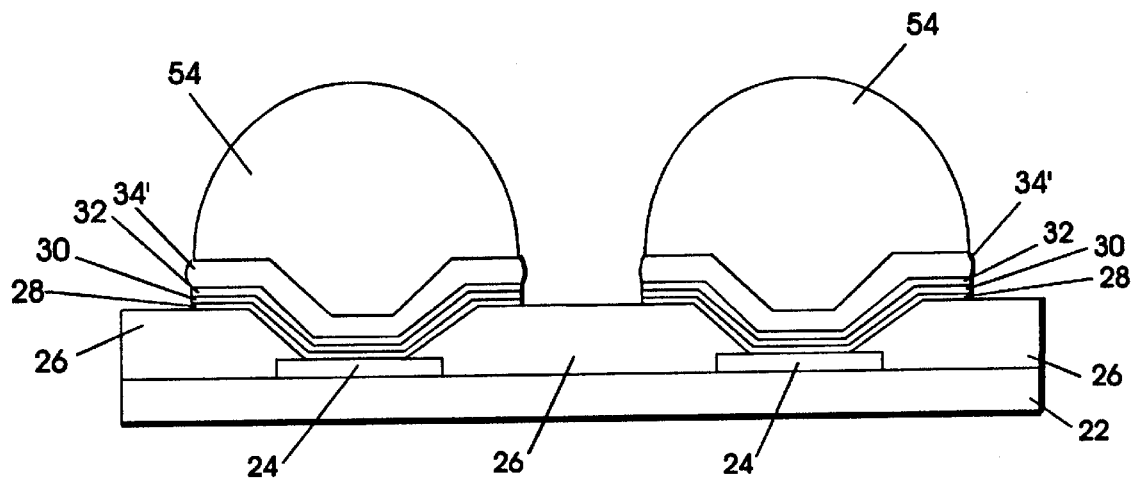

As discussed above with regard to FIGS. 5 and 6, the solder bumps define exposed and unexposed portions of the under bump metallurgy layer and titanium barrier layer, and the exposed portions are removed so that each solder bump is electrically isolated as shown in FIG. 12. The solder dam 50 is first removed using an etchant such as hydrofluoric acid buffered with ammonium fluoride. The under bump metallurgy layer and titanium barrier layer are then removed as discussed above with regard to FIGS. 5 and 6.

In the drawings and specification, there have been disclosed typical preferred embodiments of the invention and, although specific terms are employed, they are used in a generic and descriptive sense only and not for the purpose of limitation, the scope of the invention being set forth in the following claims.

That which is claimed:

1. A solder bump structure for a microelectronic device comprising:

a substrate;

a plurality of contact pads on said substrate, each of said contact pads having an exposed surface portion opposite said substrate;

a continuous titanium barrier layer extending across said substrate and contacting each of said exposed surface portions of each of said contact pads;

a continuous under bump metallurgy layer on and in contact with said titanium barrier layer opposite said substrate; and a solder bump on said under bump metallurgy layer opposite one of said contact pads and spatially separated from said titanium barrier layer.

2. A solder bump structure according to claim 1 wherein said continuous under bump metallurgy layer comprises:

a chromium layer on said barrier layer;

a phased layer of chromium and copper on said chromium layer opposite said barrier layer; and a copper layer on said phased layer opposite said chromium layer.

3. A solder bump structure according to claim 1 wherein said plurality of contact pads comprise a plurality of titanium contact pads.

4. A solder bump structure according to claim 1 wherein said solder bump defines an exposed portion of said under bump metallurgy layer and further comprising a solder dam layer on said exposed portion of said under bump metallurgy layer opposite said barrier layer.

5. A solder bump structure according to claim 4 wherein said solder dam layer comprises a solder non-wettable layer.

6. A solder bump structure according to claim 4, wherein said solder dam layer comprises a solder non-wettable layer.

7. A solder bump structure according to claim 5, wherein said solder non-wettable layer is selected from the group consisting of a titanium layer and a chromium layer.

* * * * *